United States Patent [19]

Gomi et al.

[11] 4,247,867

[45] Jan. 27, 1981

[54] APPARATUS FOR PROCESSING THE OUTPUT VOLTAGE OF A DETECTION CIRCUIT

[75] Inventors: Hiroshi Gomi; Shinichiro Taguchi, both of Fukaya, Japan

[73] Assignee: Tokyo Shibaura Electric Co., Ltd., Kawasaki, Japan

[21] Appl. No.: 941,366

[22] Filed: Sep. 11, 1978

Related U.S. Application Data

[63] Continuation of Ser. No. 775,584, Mar. 8, 1977, abandoned.

[30] Foreign Application Priority Data

Mar. 9, 1976 [JP] Japan ................................ 51-24649
Mar. 9, 1976 [JP] Japan ................................ 51-27064

[51] Int. Cl.³ .................... H04N 9/46; H04N 9/49; H03B 3/06; H03D 3/18
[52] U.S. Cl. .................................. 358/19; 358/26; 331/25; 329/50
[58] Field of Search .................. 358/8, 19, 20, 26, 27, 358/28, 158, 159; 331/18, 20, 25; 307/295, 310; 328/133, 134; 329/50

[56] References Cited

U.S. PATENT DOCUMENTS

| | | | |
|---|---|---|---|
| 3,659,040 | 4/1972 | Fujita | 358/19 |
| 3,740,456 | 6/1973 | Harwood | 358/19 |
| 3,740,461 | 6/1973 | Harwood | 358/19 |
| 4,056,826 | 11/1977 | Watanabe et al. | 358/19 |

Primary Examiner—John C. Martin
Attorney, Agent, or Firm—Cushman, Darby & Cushman

[57] ABSTRACT

The apparatus comprises a phase detection circuit for detecting the phase difference between two input signals to produce a single output which is supplied to charge a capacitor through a gate circuit and a unidirectionally conductive element. The terminal voltage of the capacitor is applied to one control terminal of a differential load circuit. The other control terminal of the load circuit is connected to receive the voltage produced by a bias circuit similar to the gate circuit.

10 Claims, 5 Drawing Figures

APPARATUS FOR PROCESSING THE OUTPUT VOLTAGE OF A DETECTION CIRCUIT

This is a continuation, of application Ser. No. 775,584 filed Mar. 8, 1977, now abandoned.

This invention relates to apparatus for processing the output voltage of a detector for producing a signal related to the color signal of a color television receiving set, and more particularly to a device which can readily be incorporated into an integrated circuit, not affected substantially by an offset voltage or temperature drift, and can rapidly sample sampling voltage and hold it stably.

Where a phase detection circuit utilized in a color killer circuit or an automatic phase control circuit of a color television receiving set is incorporated into an integrated circuit a differential type detection circuit has generally been used. Such phase detection circuit usually comprises a differential amplifier including differentially combined transistors or a doubly balanced type differential amplifier constituted by combining two emitters of the first mentioned differential amplifier. In each case, a detection output proportional to the phase difference between two signals is produced across a load resistor of the differential amplifier of one stage and the output is applied to the load circuit of the differential amplifier of the succeeding stage. As above described, according to the prior art phase detection circuit the phase detection circuit produces two differential outputs which are applied to differentially connected load circuits. In the prior art detection circuit of the type described above, a load having a filter characteristic is connected to the output of the detection circuit for the purpose of producing a desired detected output, and the load circuit generally comprises a resistor and a capacitor which are connected in parallel. Since the capacitor has a large capacitance it is difficult to incorporate it into an integrated circuit so that it is constructed as an independent element external to the integrated circuit. For this reason, according to the prior art construction, the integrated circuit is provided with two connecting pins for connecting with the external capacitor. In a recent trend of assembling various circuit elements into a single integrated circuit, the problem is how to decrease the number of the terminal pins of the integrated circuit as well as the number of the external circuit elements. Because, as the number of the terminal pins increases, the size of the integrated circuit increases and the disadvantage of using external circuit elements still remains. Efforts have been made to decrease as far as possible the number of the terminal pins. In the phase detection circuit too it has been tried to decrease two terminal pins utilized for the connection with the load to a single pin. The use of a single terminal pin enables to replace a constant current load utilizing a transistor for a resistive load of the differential detection circuit thereby decreasing two differential outputs of the detector to a single output. According to this design although it is possible to reduce the number of the terminal pins of the integrated circuit to one, it is necessary that the transistor constituting the constant current load should have a conductivity type different from that of the transistors which constitute the detection circuit and other circuits. For example, when incorporating into an integrated circuit, the transistor constituting the detection circuit is of the NPN type whereas the transistor constituting the constant current load should be of the PNP type. Although it is possible to prepare such different types of transistors by integrated circuit technique, the construction of the resulting integrated circuit is complicated. Moreover, as the reliability of the PNP type transistor is inferior to that of the NPN type transistor so that it is not advantageous to assemble them in the same integrated circuit. Moreover, when the number of the terminal pin is reduced to one, the output of the detector is caused to vary by the variations in the source voltage and the ambient temperature thus varying output voltage supplied to the load circuit. U.S. Pat. No. 3,740,456 discloses a circuit arrangement capable of substituting a resistive load for a constant current load constituted by a transistor and utilized in detection circuit having a single terminal pin. This patent discloses an electric signal processing circuit wherein a single resistance is connected to a doubly balanced type detection circuit to act as the load and a single output across the resistor is applied to a load circuit through a switching circuit. Although this processing circuit can operate satisfactory, the load circuit (a variable phase shifter) is not symmetrical with respect to the switching circuit. Moreover, as the switching is made alternately for different operations the output is caused to vary greatly due to the offset voltage and temperature variation. Furthermore, since two switching circuits are necessary each associated with a capacitor independently of the integrated circuit, thus requiring two terminal pins. With this circuit construction, as the charging and discharge currents of the switched capacitor flow through the resistor its time constant is large with the result that the response speed of the capacitor terminal voltage to the variation in the level of the input signal becomes low. Where the pulse width of the input signal is smaller than that of the gate pulse there is a fear that the charging voltage of the capacitor may discharge the capacitor.

Accordingly, it is an object of this invention to provide an improved apparatus for processing the output voltage of a detection circuit which is suitable to be incorporated into an integrated circuit not requiring external circuit elements.

Another object of this invention is to provide apparatus for processing the output of a detection circuit capable of using a resistive element as the load of the detection circuit.

Still another object of this invention is to provide an improved apparatus for processing the output of a detection circuit capable of forming transistors of the same type.

A further object of this invention is to provide apparatus for processing the output of a detection circuit which can operate stably irrespective of the variations in the source voltage and ambient temperature.

Still further object of this invention is to provide apparatus for processing the output of a detection circuit capable of rapidly discharging a capacitor of the detection circuit without delay.

According to this invention, these and other objects can be accomplished by providing apparatus for processing the output voltage of a detection circuit comprising a differential detection circuit connected to a single resistive load for detecting the phase difference between two signals, said detection circuit producing a single output and being provided with an output terminal, a gate circuit connected to the output terminal for selectively deriving out the single output, a first capacitor connected to an output terminal of the gate circuit, a differential load circuit with one of its control terminal connected to a junction between the first capacitor and the gate circuit, and a bias circuit having an similar construction to that of the first mentioned gate circuit and connected to the control terminal of the load circuit.

The apparatus of this invention described above has the following advantages. Since the phase detection circuit is required to produce only one output it is possible to use a simple resistive load. Furthermore, as the phase detection circuit has no load having constant current characteristics it is possible to construct the apparatus with transistors of the same conductivity type. The only external circuit element is a capacitor connected to the gate circuit. For this reason the apparatus of this invention can readily be fabricated as an integrating circuit thereby reducing the size of the apparatus.

Moreover, a gate circuit, an similar bias circuit and a differential load circuit are used, the operation of the apparatus is not affected by the variations in the source voltage and the ambient temperature.

The output of the gate circuit is supplied to the capacitor via a unidirectional element ON-OFF controlled by the output so that the charging of the capacitor can be made rapidly without any time lag thus improving the control speed of the load circuit.

Further objects and advantages of the invention can be more fully understood from the following detailed description taken in conjunction with the accompanying drawings in which.

Figure 1:
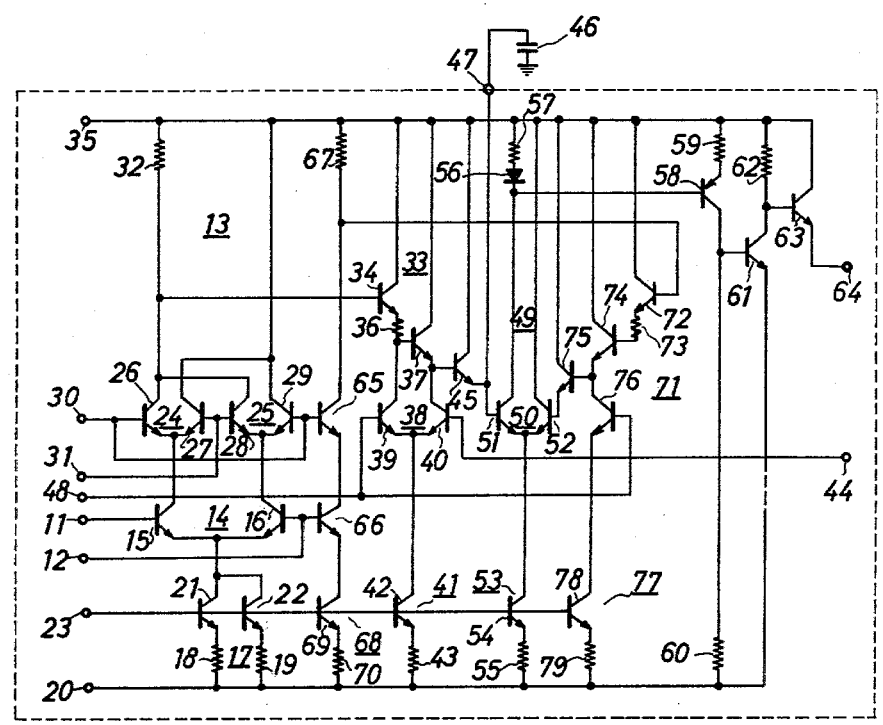
FIG. 1 is a connection diagram showing one embodiment of the apparatus for processing the output voltage of a detection circuit embodying the invention.

FIG. 1 shows an application to a color killer circuit of an apparatus according to this invention which processes an output voltage of a detection circuit. The apparatus is provided with input terminals 11 and 12 for receiving a burst signal which is a differential output from a burst amplifier, not shown. In this case either one of the input terminals 11 or 12 may be used as a fixed bias. The burst signal is impressed upon the base electrodes of transistors 15 and 16 comprising a first differential amplifier 14 of a phase detection circuit 13. The emitter electrodes of transistors 15 and 16 are commonly connected to a source of constant current 17 comprising a pair of transistors 21 and 22 with their collector electrodes connected to the emitter electrodes of transistors 15 and 16 and emitter electrodes connected to the grounded terminal 20 through resistors 18 and 19 respectively. A predetermined bias voltage is applied to the base electrodes of the transistors 21 and 22 through a terminal 23. The burst signal from the first differential amplifier 14 is applied to the emitter junctions of pairs of transistors 26, 27 and 28, 29 respectively, which constitute second and third differential amplifier 24 and 25. The base electrodes of transistors 26 and 29 are supplied with a predetermined bias voltage through a terminal 30 while the base electrodes of transistors 27 and 28 are supplied with a reference subcarrier wave signal through a terminal 31.

The second and third differential amplifiers 24 and 25 are connected to form a doubly balanced type so as to constitute a multiplying circuit for the reference subcarrier wave signal and the burst signal. If it is supposed that a color synchronism is accomplished by the multiplying circuit, the burst signal and the reference subcarrier wave signal are always in synchronism or opposite phase thereby producing a maximum detection output across the collector electrodes of the transistors 26 and 29. In the case of a white and black colored picture broadcasting the detection output across the collector electrodes of the transistors 26 and 29 is zero. One of the detection output is derived out through a collector resistor 32 and applied to the base electrode of a transistor 34 that constitutes a gate circuit 33. The collector electrode of this transistor 34 is connected to a source terminal 35 while the emitter electrode is connected through resistor 36 to the base electrode of a transistor 37 also comprising the gate circuit 33 and to the collector electrode of a transistor 39 constituting a fourth differential amplifier 38. The emitter electrode of the transistor 39 is connected to the emitter electrode of the other transistor 40 and these emitter electrodes are commonly connected to a source of constant current 41. The source 41 comprises a transistor 42 with its collector electrode connected to the emitter electrodes of the transistors 39 and 40, and a resistor 43 connected between the emitter electrode of transistor 42 and the grounded terminal 20. The base electrode of the transistor 42 is connected to the terminal 23 of the bias voltage. The base electrode of transistor 40 is supplied with a gate pulse through a terminal 44 and the collector electrode is connected to the emitter electrode of transistor 37 and the base electrode of transistor 45. The collector electrode of this transistor 45 is connected to the source terminal 35 whereas its emitter electrode is connected to a capacitor 46 acting as a filter through an external terminal 47. The base electrode of the other transistor 39 of the fourth differential amplifier 38 is connected to receive a predetermined bias voltage through a terminal 48. Thus, the gate circuit 33 performs a switching operation in response to a gate pulse. More particularly, when a gate pulse is applied to the transistor 40, the transistor 40 is turned ON whereas transistor 39 is turned OFF. When transistor 40 turns ON, transistor 37 is also turned ON whereby the detection output charges the capacitor 46 through transistor 34, resistor 36 and through transistors 37 and 45. In the absence of the gate pulse, transistor 40 is turned OFF whereas the transistor 39 is turned ON. As a consequence, the emitter-collector current of the transistor 34 flows through resistor 36 and transistor 39 thereby producing a voltage drop across resistor 36. This voltage drop decreases the base voltage of transistor 37 which in turn decreases the base potential of transistor 37. Further as the transistor 40 is in its OFF state transistor 37 is turned OFF. As a consequence, when the gate pulse coincides with the burst interval the output of the transistor 37 is obtained only during the burst interval. Since this output signal charges the capacitor 46 through transistor 45 the charging is effected without any time delay thereby rapidly charging in accordance with the input signal level. The voltage across the charged capacitor 46 is impressed upon the base electrode of the transistor 51 of the fifth differential amplifier 50 which constitutes a load circuit 49 (a killer switch circuit). The emitter electrodes of transistors 51 and 52 are commonly connected to a source of constant current 53 comprising a transistor 54 with its collector electrodes connected to the emitter electrodes of transistors 51 and 52 and the base electrode connected to terminal 23, and a resistor 55 connected between the emitter electrode of the transistor 54 and the grounded terminal 20. The collector electrode of the transistor 51 is supplied with an operating voltage from a source terminal 35 via a diode 56 and a resistor 57 while the collector electrode of the other transistor 52 is connected directly to the source terminal 35. Accordingly, when transistor 45 is turned ON to charge capacitor 46 to a voltage above a predetermined voltage transistor 51 is turned ON while transistor 52 is turned OFF. When the transistor 51 is turned ON current flows through resistor 57 and diode 56. The voltage drop across the resistor 57 turns ON PNP type transistor 58 connected to collector electrode of the transistor 51. The emitter electrode of transistor 58 is connected to the source terminal 35 through a emitter resistor 59 while the collector electrode is connected to the grounded terminal 20 through a resistor 60 connected to the base electrode of the transistor 61. When transistor 58 is turned ON transistor 61 is turned ON. The collector electrode of transistor 61 is supplied with the operating voltage via a collector resistor 62 and connected to the base electrode of transistor 63. Since the collector of the transistor 63 is connected to the source terminal 35, when the transistor 61 is turned ON, the collector potential of the transistor 61 is lowered and the transistor 63 delivers a low potential output to the output terminal 64. When, on the other hand, the transistor 51 is turned OFF, the transistors 58 and 61 are turned OFF to cause the collector potential of the transistor 61 to be raised. As a result, a transistor 63 delivers a high potential output to the output terminal 64. The high and low potential outputs are utilized as a killer voltage and compared with a predetermined voltage of a utilization circuit for collor killer operation.

Load circuit 49 is constructed as a differential type so that the operation of the other transistor 52 will be considered. More particularly, the base electrodes of the transistors 65 and 66 are connected to the base electrodes respectively of the transistors 29 and 16 which constitute a phase detection circuit 13. The collector electrode of transistor 65 is connected to the source terminal 35 via resistor 67 while the emitter electrode is connected to the collector electrode of transistor 66 having an emitter electrode connected to a source of constant current 68. This source of constant current circuit 68 comprises a transistor 69 with its collector electrode connected to the emitter electrode of the transistor 66 and the base electrode connected to the terminal 23, and a resistor 70 connected between the emitter electrode of the transistor 69 and the grounded terminal 70.

Although the base electrode of the transistor 66 is supplied with a burst signal via input terminal 12, since its emitter electrode is connected to the source of constant current 68 the impedance as viewed from the emitter side can be considered infinity. Accordingly, a signal component is not produced on the collector side but only a DC component appears. Thus, a voltage substantially equal to the DC level appearing across the resistor 32 of the phase detection circuit 13 in the absence of the input signal appears across the resistor 67. This voltage can readily be obtained by setting the resistance values of the sources of constant current 17 and 68 by resistors 32 and 67. This DC voltage is applied to a transistor 72 that constitutes a bias circuit 71 and the emitter electrode of transistor 72 is connected to the base electrode of a transistor 74 via a resistor 73. The collector electrodes of the transistors 72 and 74 are connected to the source terminal 35. The emitter electrode of transistor 74 is connected to the base electrode of transistor 75 having a collector electrode connected to the source terminal 35 and an emitter electrode connected to the base electrode of the transistor 52. Further, the emitter electrode of transistor 74 is connected to the collector electrode of a transistor 76 with its emitter electrode connected to a source of constant current 77. This source 77 is constituted by a transistor 78 with its collector electrode connected to the emitter electrode of transistor 76 and the base electrode connected to the terminal 23, and a resistor 79 connected between the emitter electrode of the transistor 78 and the grounded terminal 20. The base electrodes of transistors 76 and 39 are commonly connected to the bias terminal 48. Consequently, in the absence of an input signal a substantially equal voltage is applied to the base electrode of a transistor 52 via transistors 72, 74 and 75 of Darlington construction to act as a comparison voltage of the differential load. As above described, the bias circuit 71 has substantially the same construction as the gate circuit 33 and the bias circuit 71 may be considered symmetrical when considering a DC level. Strictly, however, its construction is substantially the same when the gate circuit 33 operates. In order to construct the bias circuit 71 closer to the gate circuit 33, a gate pulse may also be applied to a gate pulse input (not shown) of the bias circuit 71 so as to cause it to perform a switching operation.

With the construction described above, it is possible to produce a killer voltage at the output terminal 64, and to supply to the load circuit 49 the output from the phase detection circuit 13 by the gate pulse during the burst interval, and a DC voltage which is substantially equal when no input signal is applied to the phase detection circuit 13. The DC voltages are substantially equal at the load circuit 49 when there is no input signal, so that for a given variation of the source voltage these DC voltages vary in the same manner at a constant ratio at the load circuit 49. Furthermore, the temperature dependencies are also the same. Accordingly, the influence of the variations in the source voltage and temperature upon the output can be decreased greatly.

Since terminals 11, 12, 23, 30, 31, 35, 44, 48 and 64 and the grounded terminal 20 can also be used for other elements of the integrated circuit the external terminal of the phase control circuit that is necessary to connect it with an external circuit is the terminal 47 alone for connecting with capacitor 46. Moreover, the phase detection circuit 13 can use a resistive load, that is resistor 32, and not required to use any load having a constant current characteristic so that it is possible to fabricate NPN type transistors having high accuracies and can readily be manufactured in the integrated circuit.

Although in the above-mentioned embodiment only the transistor 58 is constructed of a PNP type so as to simplify the circuit, it can be constructed of a NPN type, considering the other transistors in the circuit. The transistors 61 and 63 are merely an amplification circuit and can be omitted together the diode 56. In this case, the output terminal may be connected between the resistor 57 and the collector of the transistor 51.

Figure 2:
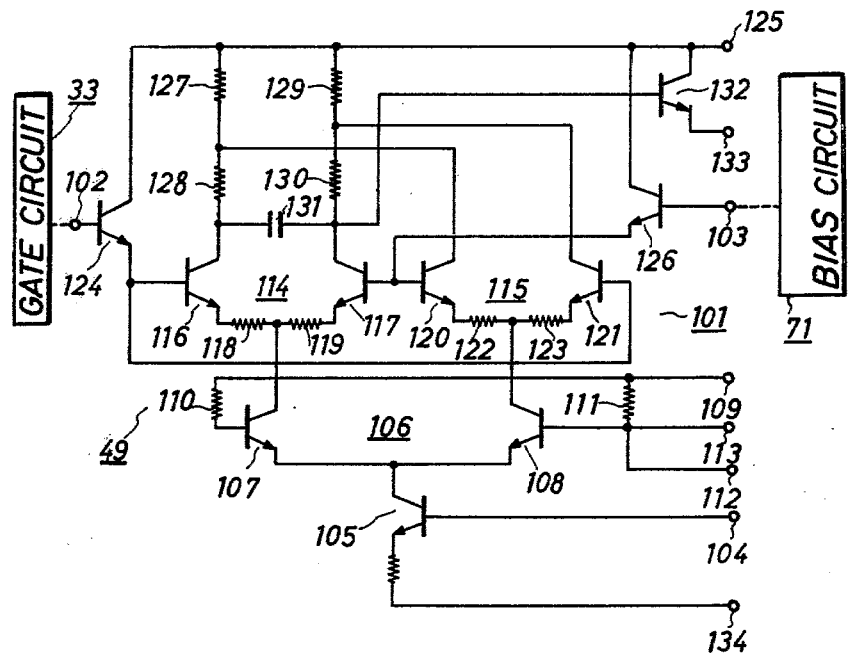
FIG. 2 is a connection diagram showing another example of the load circuit of the processing apparatus of this invention.

FIG. 1 shows an application of this invention to a color killer circuit in which the phase detection circuit comprises a killer detection circuit and the load circuit comprises a killer switching circuit. FIG. 2 shows an application of this invention to a phase detection control circuit for a reference subcarrier wave signal oscillator in which a reference subcarrier wave signal oscillator 101 is shown as the load circuit 49. As shown, a terminal 102 is connected to the junction between the emitter electrode of transistor 45 and capacitor 46 for supplying the output from the gate circuit 33. The terminal 103 is connected to the emitter electrode of transistor 75 of the bias circuit 71 these receiving the output thereof. Thus, the circuit arrangement of FIG. 2 is identical to that shown in FIG. 1 except load circuit 49. In FIG. 2, as the phase detection circuit 13 comprises the detection circuit of the automatic phase control circuit a signal in which the burst signal and the reference subcarrier wave signal have a phase difference of 90° is applied to the detection circuit 13. For this reason, in the absence of a color synchronism the output of the detection circuit is zero provided that the phase difference between the burst signal and the subcarrier wave signal is 90°. If the phase of the reference subcarrier wave signal shifts with respect to the phase of the burst signal, a detection output proportional to the phase shift is produced which is supplied to the reference subcarrier wave signal oscillator 101 which acts as the load circuit via the gate circuit 33 thereby correcting the shift of the oscillation frequency.

The construction of the reference subcarrier wave signal oscillator will now be described briefly. Thus, the emitter electrodes of a pair of transistors 107 and 108 that constitute a differential amplifier 106 is connected to a source of constant current 105 which is connected to be supplied with a predetermined bias voltage from terminal 104. The base electrodes of these transistors are supplied from terminal 109 with a predetermined bias voltage through resistors 110 and 111 respectively. Further, the base electrode of transistor 108 is supplied with an oscillator input signal from a terminal 112. The oscillator input is supplied to other circuits through a terminal 113. The collector electrodes of transistors 107 and 108 are connected to differential amplifiers 114 and 115. The differential amplifier 114 comprises a pair of transistors 116 and 117 having emitter electrodes connected together through resistors 118 ans 119. The collector electrode of the transistor 107 is connected to the junction between these resistors 118 and 119. In the same manner, the differential amplifier 115 also comprises a pair of transistors 120 and 121 with their emitter electrodes connected together through resistors 122 and 123, the juncture therebetween being connected to the collector electrode of the transistor 108. The base electrodes of transistors 121 and 116 are connected together and the base electrodes of transistors 116 and 117 are also connected together. Furthermore, the base electrode of transistor 116 is connected to the emitter electrode of the transistor 124. The base electrode of this transistor 124 is connected to a terminal 102 whereas the collector electrode is connected to a source terminal 125. The base electrodes of transistors 117 and 120 are connected to the emitter electrode of the transistor 126 having a base electrode connected to a terminal 103, and a collector electrode connected to a source terminal 125. Between the source terminal 125 and the collector electrodes of transistors 116 and 117 are connected resistors 127, 128 and resistors 129 and 130 which are connected in series respectively. The juncture between resistors 127 and 128 is connected to the collector electrode of the transistor 120 while the juncture between resistors 129 and 130 is connected to the collector electrode of transistor 121. A capacitor 131 is connected between the collector electrodes of transistors 116 and 117 and the junction between the capacitor 131 and the collector electrode of transistor 117 is connected to the base electrode of the transistor 132. The collector electrode of this transistor 132 is connected to a source terminal 125 whereas the emitter electrode is connected to the output terminal 133 of the oscillator. The differential amplifiers 114 and 115 are connected to form a doubly balanced type and the oscillation circuit is constituted by the differential amplifiers 114, 115 and 106 and capacitor 131. A grounded terminal 134 is connected to the emitter electrode of transistor 105.

As above described, a reference subcarrier wave signal oscillator is substituted for the killer switching circuit shown in FIG. 1 to act as the load circuit. The load circuit may be any circuit provided that it is connected to act as a differential load.

Figure 3:
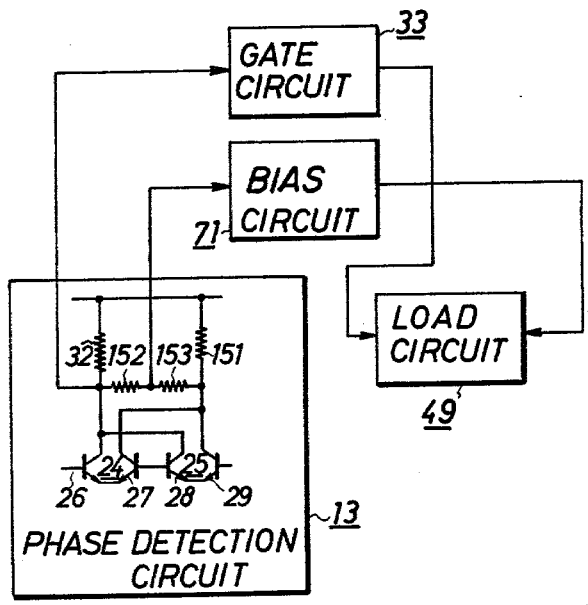
FIG. 3 is a block diagram showing another example of the detection circuit.

FIG. 3 shows a modification of this invention wherein the apparatus for processing the output voltage of a detection circuit constituting the phase detection control circuit, that is the connection between the gate circuit and the bias circuit, and the phase detection circuit has been modified. The circuit elements corresponding to those shown in FIG. 1 are designated by the same reference numerals.

More particularly, a resistor 151 is connected to the collector electrode of transistor 29 constituting the phase detection circuit 13 and serially connected resistors 152 and 153 are connected across the junction between the collector electrode of transistor 29 and resistor 151 and the junction between the collector electrode of transistor 26 and resistor 32. The bias circuit 71 is connected to the junction between resistors 152 and 153, whereas the gate circuit 33 is connected to the junction between resistors 32 and 152. Accordingly, the AC component of the detected output produced on the collector side of transistor 26 and that of the detected output produced on the collector side of transistor 29 have opposite phases so that these AC components cancel with each other at the junction between resistors 152 and 153. As a consequence, a DC voltage corresponding to the DC component produced at the time of no input signal appears at the junction between resistors 152 and 153 and this DC voltage is applied to the bias circuit 71. The detection output is derived out from the junction between resistor 32 and the collector electrode of transistor 26 and supplied to the gate circuit 33. The circuit shown in FIG. 3 operates in the same manner as that shown in FIG. 1 but transistors 65 and 66 and the source of constant current 68 are eliminated thus simplifying the circuit construction.

Figure 4:
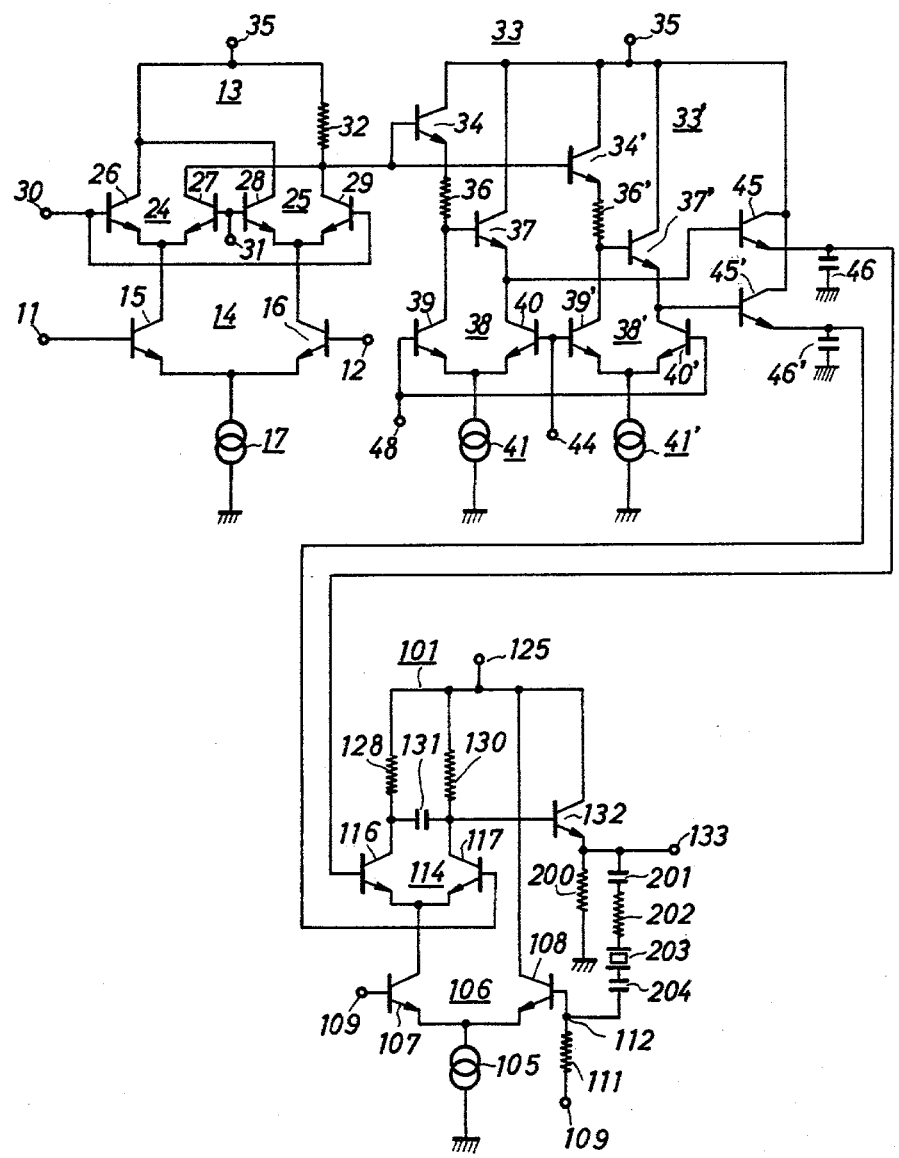
FIG. 4 is a connection diagram showing a modified embodiment of this invention.

FIG. 4 shows an application of this invention to the automatic phase control circuit of a color television receiving set. Briefly described, the outputs of the gate circuits 33 and 33' are used to control a reference subcarrier wave signal oscillator 101 of the voltage controlled type and the output of the subcarrier wave signal oscillator 101 is applied to a phase shifter, not shown. This output is also applied to the phase detection circuit 13 together with the burst signal. The output of the phase detection circuit 13 is applied to the gate circuits 33 and 33' thus forming an automatic phase control loop. The phase detection circuit 13 has substantially the same construction as that shown in FIG. 1 except that resistor 32 is connected to the collector side of the transistor 29 and that the collector electrode of transistor 26 is connected directly to the source terminal 35. Different from the case of a color killer circuit, the base electrodes of transistors 26 and 29 are connected to the input terminal 30 of the subcarrier wave signal, the base electrode of the transistor 15 is connected to the input terminal 11 of the burst signal, and the base electrode of transistor 16 is connected to the bias voltage terminal 12. The output is derived out from the collector electrode of the transistor 29 and supplied to the gate circuits 33 and 33' which are constructed to produce a voltage corresponding to the gated portion of the input signal and a voltage corresponding to the remaining portion of the input signal. The detected signal is applied to the base electrodes of transistors 34 and 34'. The collector electrodes of these transistors 34 and 34' are connected to the source terminal 35 and their emitter electrodes are connected to the base electrodes of transistors 37 and 37' respectively through resistors 36 and 36'. The base electrode of transistor 37 is connected to the collector electrode of transistor 39 while the emitter electrode is connected to the collector electrode of transistor 40. The emitter electrodes of transistors 39 and 40 are commonly connected and then grounded through the source of constant current 41. The base electrode of transistor 37' is connected to the collector electrode of transistor 39' while the emitter electrode is connected to the collector electrode of transistor 40'. The emitter electrodes of transistors 39' and 40' are commonly connected to the grounded through the source of constant current 41'. The base electrodes of transistors 40 and 39' are commonly connected and connected to the input terminal 44 of a gate pulse. The base electrodes of transistors 39 and 40' are connected to a bias voltage terminal 48. Transistor 34, resistor 36, transistors 37, 39 and 40 and the source of constant current 41 are connected to form one gate circuit 33 whereas transistor 34', resistor 36', transistors 37', 39' and 40' and source of constant current 41' constitute the other gate circuit 33'. The output of the gate circuit 33 is derived out from the junction between the collector electrode of transistor 40 and the emitter electrode of transistor 37. This junction is connected to the base electrode of transistor 45. The output of the other gate circuit 33' is derived out from the junction between the collector electrode of transistor 40' and the emitter electrode of transistor 37', the junction being connected to the base electrode of transistor 45'. The emitter electrodes of transistors 45 and 45' are grounded respectively through capacitors 46 and 46' and connected to the reference subcarrier wave signal oscillator 101.

The reference subcarrier wave signal oscillator 101 comprises a Rennick oscillator wherein the output terminals of the gate circuits 33 and 33' are connected to the base electrodes of transistors 116 and 117 through transistors 45 and 45' respectively. The collector electrodes of transistors 116 and 117 are connected together through a capacitor 131 and to the source terminal 125 through resistors 128 and 130 respectively. The emitter electrodes of transistors 116 and 117 are commonly connected to the collector electrode of transistor 107. The emitter electrode of transistor 107 is connected to the emitter electrode of transistor 108 and the junction of these emitter electrodes is grounded through cource of constant current 105. The collector electrode of the transistor 108 is connected to a source terminal 125. The collector electrode of the transistor 117 is connected to the base electrode of transistor 132. The collector electrode of transistor 132 is connected to the source terminal 125 while the emitter electrode is grounded via resistor 200 and also connected to an output terminal 133 which is connected to the base electrode of transistor 108 via a capacitor 201, a resistor 202, a quartz oscillation element 203, and a capacitor 204 which are connected in series. The base electrode of transistor 108 is also connected to bias voltage terminal 109 via a resistor 111.

Accordingly, the circuit shown in FIG. 4 is different from that shown in FIG. 1 in that gate circuit 31' replaces bias circuit 71. Further, the circuit shown in FIG. 4 is different from that shown in FIG. 2 in that a simple differential circuit is substituted for the reference subcarrier wave signal oscillator 101. Remaining circuit construction is identical to those shown in FIGS. 1 and 2.

Figure 5:
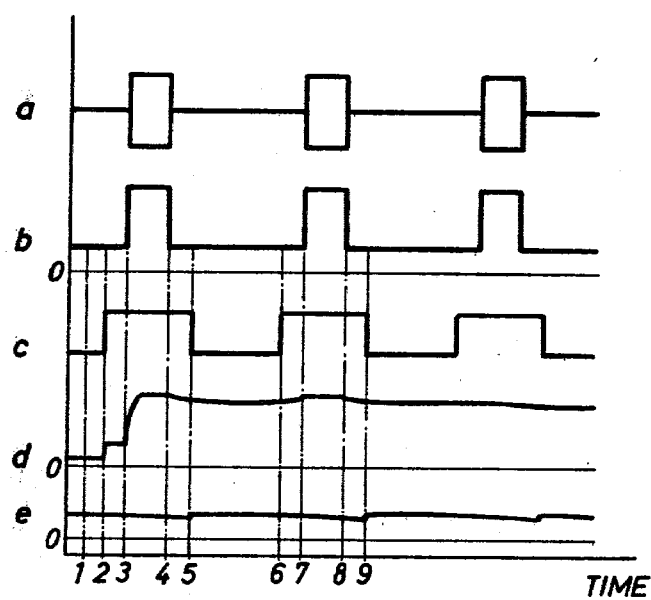
FIG. 5 shows waveforms of various portions useful to explain the operation of the modified embodiment shown in FIG. 4.

In the automatic phase control circuit described above when a subcarrier wave signal is applied to the input terminal 30 of the phase detection circuit 13, and a burst signal as shown in FIG. 5a is applied to the input terminal 11 a detection output as shown in FIG. 5b appears on the collector electrode of transistor 29 and this output is applied to the gate circuits 33 and 33'. Furthermore, a gate pulse as shown in FIG. 5c is applied to the gate pulse input terminal 44 of the gate circuits 33 and 33'. Under a condition wherein a portion other than the pulse signal, or the detection output shown in FIG. 5b is applied and the gate pulse is not applied, that is at a time 1 shown in FIG. 5, transistor 39 of one gate circuit 33 is turned ON to pass the detection output as shown in FIG. 5b through the transistor 39. The other portion of the output is applied to the capacitor 46 via transistors 37 and 45 thus accumulating a voltage shown in FIG. 5d in the capacitor 46. At the same time, in the other gate circuit 33', transistor 40' is turned ON to charge capacitor 46' with the detection output as shown in FIG. 5b via transistors 37' and 45' to a voltage as shown in FIG. 5e. At a time 2 shown in FIG. 5, a gate pulse as shown in FIG. 5c is applied to the input terminal 44 thus reversing the operations of the gate circuits 33 and 33'. Namely, in the gate circuit 33, transistor 40 is turned ON and transistors 37 and 45 are also turned ON to charge capacitor 46 as shown in FIG. 5d. In the other gate circuit 33', transistor 40' is turned OFF whereas transistor 40' is turned OFf thus turning OFF transistors 37' and 45'. The terminal voltage of the capacitor 46' does not vary. At a time 3 shown in FIG. 5, the detection output builds up to form a pulse as shown in FIG. 5b so that the voltage of the capacitor 46 increases greatly as shown in FIG. 5d. However, the operation of the gate circuit 33' does not vary. At a time 4 shown in FIG. 5, the pulse of the detected output terminals so that the transistor 45 of one gate circuit 33 is turned OFf thus clamping the voltage across capacitor 46. At a time 5 the gate pulse shown in FIG. 5c disappears so that the operations of the gate circuits 33 and 33' are reversed. Thus, in the gate circuit 33, transistor 39 is turned ON while transistors 37 and 45 are turned OFF. In the other gate circuit 33', the transistor 40' is turned ON and transistors 37' and 45' are turned ON, thus stopping the charging of the capacitor 46'. At a time 6 shown in FIG. 5 a gate pulse is applied to reverse the operations of the gate circuits 33 and 33'.

However, since the base voltage of the transistor 45 of the gate circuit 33 is lower than the emitter voltage, transistor 45 is turned OFF thus stopping the charging of capacitor 46. At a time 7 shown in FIG. 5, the detection output shown in FIG. 5b builds up again to form a pulse. When the level of this pulse is sufficiently high enough to turn ON the transistor 45, the capacitor 46 will be charge by the current flowing through transistor 45. At a time 8 shown in FIG. 5, the pulse shown in FIG. 5b disappears so that the transistor 45 is turned OFF. At a time 9, the gate pulse shown in FIG. 5c disappears thus turning ON transistors 39 and 40'. At this time, if a voltage sufficient to turn ON the transistor 45' appears on the base electrode thereof, capacitor 46' will be charged. Thereafter, the operation described above is repeated.

As above described the output of the phase detection circuit 13 is gated and held by capacitors 46 and 46'. The voltages across capacitors 46 and 46' are applied to the reference subcarrier wave signal oscillator 101. In this manner, by using the two voltages it is possible to control the reference subcarrier wave signal oscillator 101 by the detected output of the form of a pulse regardless of the variation in the DC level for obtaining an oscillation output which is applied to the input terminal of the phase detection circuit 13 through the output terminal 133. The phase difference between the burst signal and the subcarrier wave signal is reflected upon the level of the output pulse of the phase detection circuit thus varying the gate output voltage with the result that the oscillation frequency is varied corresponding to the phase difference thereby matching the phases.

With the automatic phase control circuit described above, it is important that the voltage accumulated in the capacitor should be sensitive to the variation in the input signal level but there is no time lag of charging and discharging the capacitor so that the voltage across the capacitor varies rapidly in response to the variation in the input signal level. Even when a flyback pulse for the horizontal scanning having a larger pulse width than the burst interval is used as the gate pulse there is no fear of undesirable charging and discharging of the capacitor thereby positively holding the gate output.

The invention is not limited to the specific embodiments described above and many changes and modifications are possible. Thus, for example, instead of applying the voltage to the bias circuit in a manner as sown in FIGS. 1 and 3, it is possible to omit the transistors 65 and 66 shown in FIG. 1, to directly interconnect the collector electrode of transistor 69 and resistor 67 and to connect the junction therebetween to the base electrode of the transistor 72. Whether the output to the load circuit 49 should be derived out from transistor 51 or transistor 52 is determined by the configuration of the succeeding circuit so that such selection can readily be made at the time of design. Moreover, it is possible to interpose transistors between transistors 45 and 51 and between transistors 75 and 52 respectively. If necessary, resistors may be interposed between the emitter electrode of transistor 37 and the base electrode of transistor 45 and between the emitter electrode of transistor 74 and the base electrode of transistor 75.

Alternatively, transistors 45 and 75 may be replaced by resistors. It is also possible to connect the collector and emitter electrodes of a pair of other transistors between the collector and emitter electrodes of transistors 15 and 16 and to apply a gate signal to the commonly connected base electrodes of said other transistors so as to gate them. The construction of the constant current source is not limited to that shown in the drawings. It should be understood that many other changes and modifications will be obvious to one skilled in the art without departing from the spirit and scope of the invention as defined in the appended claims.

What we claim is:

1. An apparatus for processing electronic signals, comprising:
   a single resistor load;
   differential detection means having a first output terminal connected to said single resistor, said detection means for detecting the phase difference between two signals and producing a single output related to said phase difference at said first output terminal;
   gate means connected to said first output terminal, for selectively transferring said single output in response to the application of a gate signal to a second output terminal, said gate means including a first transistor through which said single output is transferred to said second output terminal, said first transistor having a control electrode responsive to said single output, one current conducting electrode connected directly to a voltage source and another current carrying electrode connected directly to said second output terminal;
   a capacitor having a first terminal directly connected to said second output terminal and a second terminal connected directly to ground;
   a differential load circuit with one of its control terminals connected to a junction between said first capacitor and said gate means; and
   a bias circuit having a third output terminal connected to the other control terminal of said differential load circuit.

2. An apparatus according to claim 1 wherein said differential detection means includes a transistor having a collector electrode connected to said single resistor, said first output terminal being located at the junction of said single resistor and said collector electrode; and the terminal of said resistor load not connected to said collector electrode being connected to a voltage source.

3. An apparatus according to claim 1 further comprising another resistor connected between a source of constant current and a voltage source, the input terminal of said bias circuit being connected at the terminal of said another resistor not connected to said voltage source.

4. An apparatus according to claim 1 wherein said load circuit comprises a color killer circuit of a color television receiving circuit.

5. An apparatus according to claim 1 wherein said load circuit comprises a reference subcarrier wave signal generator.

6. An apparatus for processing electronic signals comprising:
   a single resistor load;
   a differential detection means having a first output terminal connected to said single resistor, said detection means for detecting the phase difference between two signals and producing a single output related to said phase difference at said first output terminal;
   a first gate means connected to said first output terminal, for selectively transferring said single output in response to the application of a gate signal to a second output terminal, said gate means including a first unidirectional conductive element through which said single output is transferred to said second output terminal, said first unidirectional conductive element having a control electrode responsive to said single output, one current carrying electrode connected directly to a voltage source and another current carrying electrode connected directly to said second output terminal;

a first capacitor having a first terminal directly connected to said second output terminal and a second terminal connected directly to ground;

a second gate means having an identical structure to that of said first gate means and connected to said first output terminal for selectively transferring said single output, said second gate means including a second unidirectional conductive element through which said single output is transferred to a third output terminal, said second unidirectional conductive element having a control electrode responsive to said single output, one current carrying electrode connected directly to a voltage source and another current carrying electrode connected directly to said third output terminal;

a second capacitor having a first terminal directly connected to said third output terminal and a second terminal connected directly to ground;

means for causing said first and second gate circuits to transfer said single output alternately; and a differential load circuit with one of its control terminals connected to a junction between said first capacitor and said first unidirectional conductive element and with the other of its control terminals connected to a junction between said second capacitor and said second unidirectional conductive element.

7. An apparatus according to claim 6 wherein said differential detection means includes a transistor having a collector electrode, and wherein said single resistor load is connected between said collector electrode and a voltage source, the input terminals of said first and second gate means being connected to the junction between said single resistor load and said collector electrode.

8. An apparatus according to claim 6 wherein said load circuit comprises a reference subcarrier wave signal generator.

9. Apparatus for processing electronic signals comprising:

a single load resistor;

differential detection means having a first output terminal connected to said single resistor, said detection means for detecting the phase difference between two signals and producing a signal output related to said phase difference at said first output terminal;

gate means connected to said first output terminal, for selectively transferring said single output in response to the application of a gate signal to said gate means, said gate means including:

a transfer transistor having a first current conducting electrode connected to a voltage source and a second current conducting electrode, means for applying said single output to the control electrode of said transfer transistor, a gating transistor having a control electrode responsive to said gate signal and a current conducting electrode connected to said transfer transistor second current conducting electrode, and an output transistor having a control electrode connected to said transfer transistor second current conducting electrode, and a current conducting electrode connected directly to a second output terminal;

a capacitor having a first terminal directly connected to said second output terminal and a second terminal connected to ground;

a differential load circuit with one of its control terminals connected to the junction between said first capacitor and said gate means; and a bias circuit having a third output terminal connected to the other control terminal of said differential load circuit.

10. Apparatus for processing electronic signals comprising:

a single load resistor;

differential detection means having a first output terminal connected to said single resistor, said detection means for detecting the phase difference between two signals and producing a single output related to said phase difference at said first output terminal;

first gate means connected to said first output terminal, for selectively transferring said single output in response to the application of a gate signal to said first gate means, said gate means including:

a first transistor having a control electrode supplied with a bias voltage and a current conducting electrode responsive to said single output, a second transistor having a control electrode connected to said first transistor current conducting electrode, and having a first current conducting electrode connected to a voltage source and a second current conducting electrode, a third transistor having a control electrode supplied with said gate signal and a current conducting electrode connected to said second transistor second current conducting electrode, and a first unidirectional conductive element having a control electrode connected to said second transistor second current conducting electrode, said first unidirectional conductive element transferring said single output directly to a second output terminal;

a first capacitor having a first terminal directly connected to said second output terminal and a second terminal connected to ground;

second gate means having an identical structure to that of said first gate means and connected to said first output terminal for selectively transferring said single output, said second gate means including:

a fourth transistor having a control electrode supplied with said gate signal, and a current conducting electrode responsive to said single output, a fifth transistor having a control electrode connected to said fourth transistor current conducting electrode, a first current conducting electrode connected to a voltage source and a second current conducting electrode, a sixth transistor having a control electrode supplied with a bias voltage, and a current conducting electrode connected to said fifth transistor second current conducting electrode, and a second unidirectional conductive element having a control electrode connected to said fifth transistor second current conducting electrode, said second unidirectional conductive element transferring said single output directly to a third output terminal;

a second capacitor having a first terminal directly connected to said third output terminal and a second terminal connected to ground;

means for causing said first and second gate circuits to transfer said single output alternatively; and a differential load circuit with one of its control terminals connected to a junction between said first capacitor and said first unidirectional conductive element and with the other of its control terminals connected to a junction between said second capacitor and second unidirectional conductive element.

* * * * *